(12) United States Patent
Verbrugge et al.

(10) Patent No.: US 10,387,611 B2
(45) Date of Patent: *Aug. 20, 2019

(54) METHOD FOR MODELING A BLADE OF A NON-DUCTED PROPELLER

(71) Applicant: Safran Aircraft Engines, Paris (FR)

(72) Inventors: Cyril Verbrugge, Moissy-Cramayel (FR); Clement Marcel Maurice Dejeu, Moissy-Cramayel (FR); Anthony Pascal Eloi Louet, Moissy-Cramayel (FR); Jonathan Evert Vlastuin, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/517,185

(22) PCT Filed: Oct. 8, 2015

(86) PCT No.: PCT/FR2015/052714
§ 371 (c)(1),
(2) Date: Apr. 6, 2017

(87) PCT Pub. No.: WO2016/055743
PCT Pub. Date: Apr. 14, 2016

(65) Prior Publication Data
US 2017/0300612 A1 Oct. 19, 2017

(30) Foreign Application Priority Data
Oct. 8, 2014 (FR) .................. 14 59647

(51) Int. Cl.
*G06F 17/50* (2006.01)
*B64C 11/18* (2006.01)
*B64D 27/00* (2006.01)

(52) U.S. Cl.
CPC .......... *G06F 17/5095* (2013.01); *B64C 11/18* (2013.01); *G06F 17/5009* (2013.01); *B64D 2027/005* (2013.01); *Y02T 50/66* (2013.01)

(58) Field of Classification Search
CPC . B64C 11/18; G06F 17/5095; G06F 17/5009; F01D 5/141; F04D 27/001; F04D 29/324
See application file for complete search history.

(56) References Cited

U.S. PATENT DOCUMENTS

2006/0210395 A1* 9/2006 Schuster ............. F01D 5/141
    415/208.1
2012/0283994 A1* 11/2012 Duong ............. F01D 5/3007
    703/1

OTHER PUBLICATIONS

Fowler, Barry, and Richard Bartels. "Constraint-based curve manipulation." IEEE Computer Graphics and Applications 13.5 (1993): 43-49. (Year: 1993).*

(Continued)

*Primary Examiner* — Saif A Alhija
*Assistant Examiner* — Joshua E. Jensen
(74) *Attorney, Agent, or Firm* — Oblon, McClelland, Maier & Neustadt, L.L.P.

(57) ABSTRACT

A method for modeling an offset portion of a blade of a non-ducted propeller is provided. The method includes: parametrizing a C1-class curve representing a deformation of the blade characterizing the offset, according to a position along a section at a given height in the blade, the curve intersecting consecutively through a first bend control point, a central control point, and a second bend control point, the first and second bend control points defining the extent of the blade section, the parametrization being implemented according to a first deformation parameter defining the abscissa of the central control point, a second parameter of deformation defining the ordinate of the second bend point, and a third deformation parameter defining the angle of the (Continued)

tangent to the curve at the second bend control point; optimizing one of the deformation parameters; and plotting the values of the optimized parameters on an interface.

16 Claims, 6 Drawing Sheets

(56) References Cited

OTHER PUBLICATIONS

Maesschalck et al. ("Blade Tip Shape Optimization for Enhanced Turbine Aerothermal Performance". ASME. Turbo Expo: Power for Land, Sea, and Air, vol. 3C: Heat Transfer ():V03CT14A011. Jun. 2013) (Year: 2013).*

Fowler, Barry, and Richard Bartels. "Constraint-based curve manipulation." IEEE Computer Graphics and Applications 13.5 (1993): 43-49. (Year: 1993).*

Lepot, Ingrid, et al. "Aero-mechanical optimization of a contra-rotating open rotor and assessment of its aerodynamic and acoustic characteristics." Proceedings of the Institution of Mechanical Engineers, Part A: Journal of Power and Energy 225.7 (2011): 850-863 (Year: 2011).*

Preliminary Search Report dated Sep. 28, 2015 in FR1459647 (with English translation of category of cited documents).

International Search Report dated Feb. 5, 2016 in PCT/FR2015/052714 (with English translation).

C. De Maesschaick, et al., "Blade Tip Shape Optimization for Enhanced Turbine Aerothermal Performance", Journal of Turbomachinery, Apr. 2014, vol. 136, No. 4, XP055117474, 11 pages.

Damir Vucina, et al., "A Compact Parameterization for Shape Optimization of Aerofoils", Proccedings of the World Congress on Engineering 2008 vol. I, VCE 2008, XP055117498, 2008, 6 pages.

Zbigniew Schabowski, et al., "Aeromechanical Optimization of a Winglet-Squealer Tip for an Axieal Turbine", Journal of Turbomachinery, 2014, vol. 136, No. 7, XP055216091, 12 pages.

\* cited by examiner

METHOD FOR MODELING A BLADE OF A NON-DUCTED PROPELLER

GENERAL TECHNICAL FIELD

The present invention relates to computer aided design.

More precisely, it relates to a method for modeling a propeller blade.

PRIOR ART

Engines with "non-ducted" fans (or turboprops of the "propfan" or "open rotor" type) are a type of turbine engine, the fan whereof is positioned outside the casing, unlike conventional turbojet engines (of the "turbofan" type) in which the fan is ducted.

Figure 1:
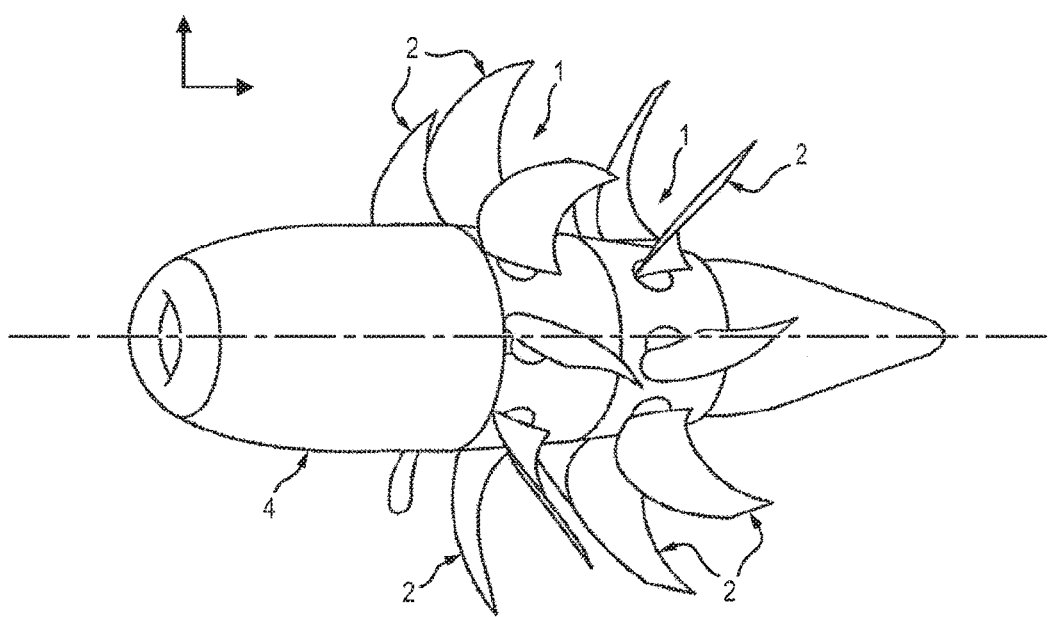

Known in particular is the "contra-rotating open rotor" (CROR), shown in FIG. 1, which is equipped with two propellers turning in opposite directions. It has received considerable attention due to its particularly high propulsive efficiency.

The aim of this type of engine is thus to retain the speed and the performance of a turbojet while retaining fuel consumption similar to that of a turboprop. The fact that the fan is not ducted actually allows the diameter and the airflow rate usable for thrust to be increased.

However, the absence of a duct causes problems in conforming to specifications. Particularly in terms of acoustics, because this type of engine generates more noise than a conventional engine. In fact, the production of thrust on each propeller blade shows the presence of a distribution of circulation over the span of the propellers. And this circulation naturally escapes at the tip of the blade (instead of being channeled by the casing), creating a so-called "wing-tip" vortex.

The interaction of this upstream marginal blade wing-tip vortex on the surfaces in rotation of the downstream propeller poses a genuine challenge, in that the strong noise that is generated is not blocked by any casing.

Current standards impose a maximum noise threshold in areas near the ground, i.e. during takeoff and approach, which current geometries will not allow to be attained.

It would be desirable to improve these geometries, in particular at the blade tips, so as to reduce the generated noise without having a major impact either on the effectiveness of the engine or its fuel consumption.

For this purpose, numerous computer modeling tools for blades or other aeronautical parts are known, which make it possible to help design these parts while automatically optimizing some of their characteristics. The principle is to determine optimum aeromechanical geometry laws of the blade, in other words one or more curves describing the value of a physical quantity (such as efficiency, pressure rise, delivery or pumping margin) along a section or an elevation of the blade, in a given environment, by executing a large number of simulation calculations.

However, the same methods are used today for designing ducted propellers and for non-ducted propellers, i.e. the modeling of 2D profiles which are later wrapped around streamlines (with respect to the angles of the profile) and stacked according to a selected and optimized stacking law.

Such solutions have proven suitable for many physical quantities of non-ducted propellers, but it remains very difficult to obtain a substantial improvement in noise levels.

Alternatively, it would be possible to use mesh deforming algorithms. Such methods continue to be contemplated because they offer many advantages in terms of cleanliness of the surface and ease of drawing. At present, however, they demand a great deal of development work before being usable in industrial design.

It would therefore be desirable to find an innovative method for modeling a non-ducted fan which would allow a substantial improvement of their aero-acoustic performance while still being economical in terms of use of computing resources.

Presentation of the Invention

The present invention proposes, according to a first aspect, a method for modeling at least one portion of a blade of a non-ducted propeller, the portion of the blade having an offset, the method being characterized in that it comprises the implementation, by data processing means of a piece of equipment, of steps of:
(a) Parameterization of a curve of at least class $C^1$ representing a deformation of said blade characterizing the offset, as a function of a position along a section at a given elevation in the blade, the curve running successively through a first end control point, a central control point and a second end control point, the first and second end control points defining the extent of said section of the blade,
the parameterization being performed according to a first deformation parameter defining the abscissa of the central control point, a second deformation parameter defining the ordinate of the second end control point, and a third deformation parameter defining the inclination of the tangent to the curve at the second end control point;
(b) Optimization of at least one of the deformation parameters;
(c) outputting to an interface of said equipment of the values of the optimized parameters.
According to other advantageous, non limiting features:
said curve comprises a non-uniform rational B-spline (NURBS) extending between the central control point and the second end point;
at least one intermediate control point is positioned between the central control point and the second end control point, the NURBS being defined by the central control point, the intermediate control point and the second end control point;
the abscissa of the $K^{th}$ intermediate control point is a function of the second and third deformation parameters;
the abscissa of the $K^{th}$ intermediate control point is given by $$x_K = 1 - \frac{y_{max}}{dy_{max}};$$

$K \geq 2$, the $K-1^{th}$ intermediate control point(s) being movable points the abscissa whereof is a function of those of the central control point and of the $K^{th}$ intermediate control point;
the abscissa of the $K-1$ movable intermediate control points is given by $$x_{i \in [\![1, K-1]\!]} = x_0 + (x_K - x_0) * \frac{i}{K}$$

with $x_K$ the abscissa of the $K^{th}$ intermediate control point;
the ordinate of each intermediate control point is equal to zero;
said curve is zero between the first end control point and the central control point;
the tangent to the curve at the central control point is horizontal;
a plurality of curves corresponding to sections at different elevations in the blade is parameterized at step (a);
the optimized values determined at step (b) are values of the parameters for which the intensity of a wing-tip vortex generated by the blade is minimal;
at least one deformation parameter is expressed as a function of the elevation of the section in the blade and of one or more complementary parameters, step (b) consisting of determining optimized values of said complementary parameters;
the method comprises, for at least one deformation parameter expressed as a function of the elevation of the section in the blade and one or more complementary parameters, a preliminary step (a0) of parameterizing at least one auxiliary curve of at least class $C^1$, representing the value of said deformation parameter as a function of the height of the section in the blade, the auxiliary curve running successively through a first end control point, a central control point and a second end control point, the first and second end control points defining the extent of said elevation of the blade,
the parameterization being implemented according to at least said complementary parameters, as a function whereof the central control point and/or the second end control point of the auxiliary curve are defined;
the complementary parameters define, for the auxiliary curve, the abscissa of the intermediate control point, the ordinate of the second end control point and/or the inclination of the tangent to the auxiliary spline at the second end point.

According to a second, then a third aspect, the invention relates to a method for manufacturing a blade of a non-ducted propeller, the blade having an offset, the method comprising steps of:
performing the method according to the first aspect so as to model at least one portion of the blade;
Manufacturing said blade in conformity with the modeling of the at least one portion of the blade obtained;
As well as a non-ducted propeller comprising a plurality of blades obtained via the method according to the second aspect.

According to a fourth aspect, the invention relates to modeling equipment for at least one portion of a blade of a non-ducted propeller, the portion of the blade having an offset, characterized in that it comprises data processing means configured to implement:
A parameterization module for a curve of at least class $C^1$ showing a deformation of said blade characterizing the offset as a function of a position along a section at a given elevation within the blade, the curve passing in succession through a first end control point, a central control point and a second end control point, the first and second end control points defining the extent of said section of the blade, the parameterization being performed according to a first deformation parameter defining the abscissa of the central control point, a second deformation parameter defining the ordinate of the second end point, and third deformation parameter defining the inclination of the tangent to the curve at the second end control point;

A module for determining optimized values of the deformation parameter(s);
A module for outputting to an interface of said equipment the values determined.

According to a fifth and a sixth aspect, the invention relates respectively to a computer program product comprising code instruction for executing a method according to the first aspect of the invention for modeling at least one portion of a blade of a non-ducted propeller; and a storage means readable by computer equipment on which a computer program product comprises code instructions for executing a method according to a first aspect of the invention for modeling at least one portion of a blade of a non-ducted propeller.

PRESENTATION OF THE FIGURES

Figure 2A:
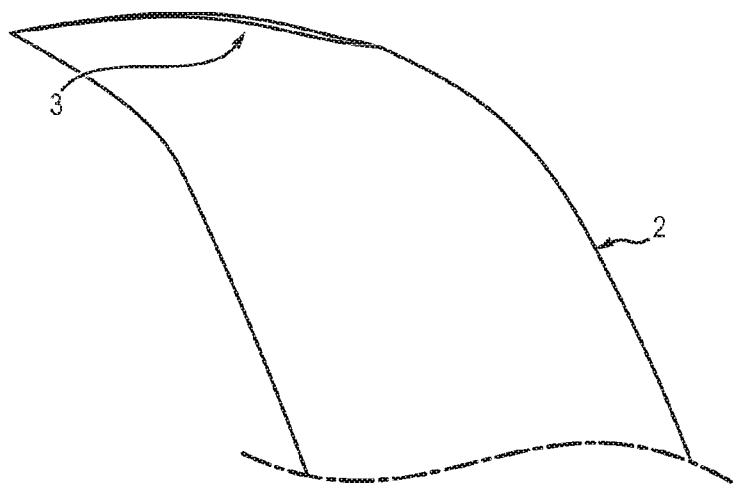
Figure 2B:
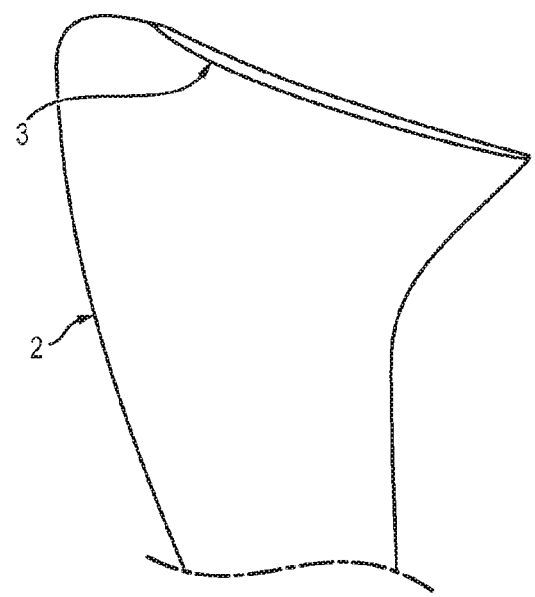
Figure 3:
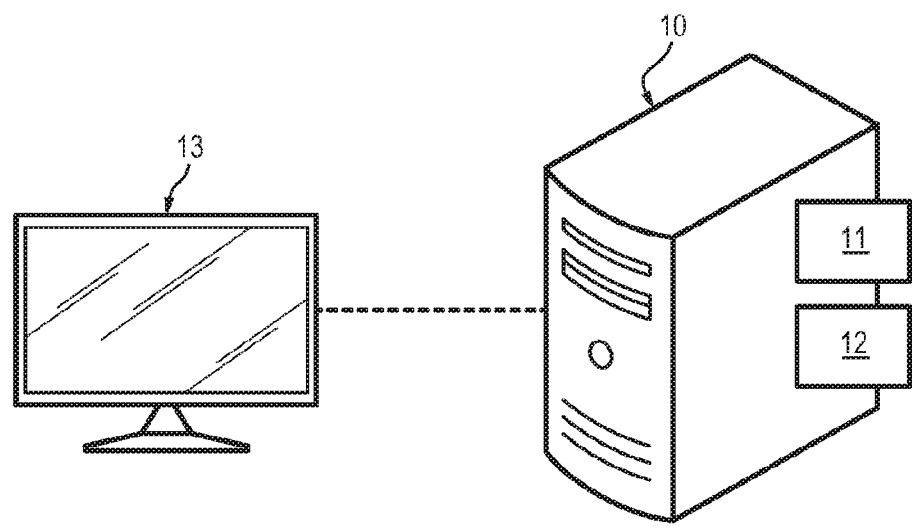
Figure 4:
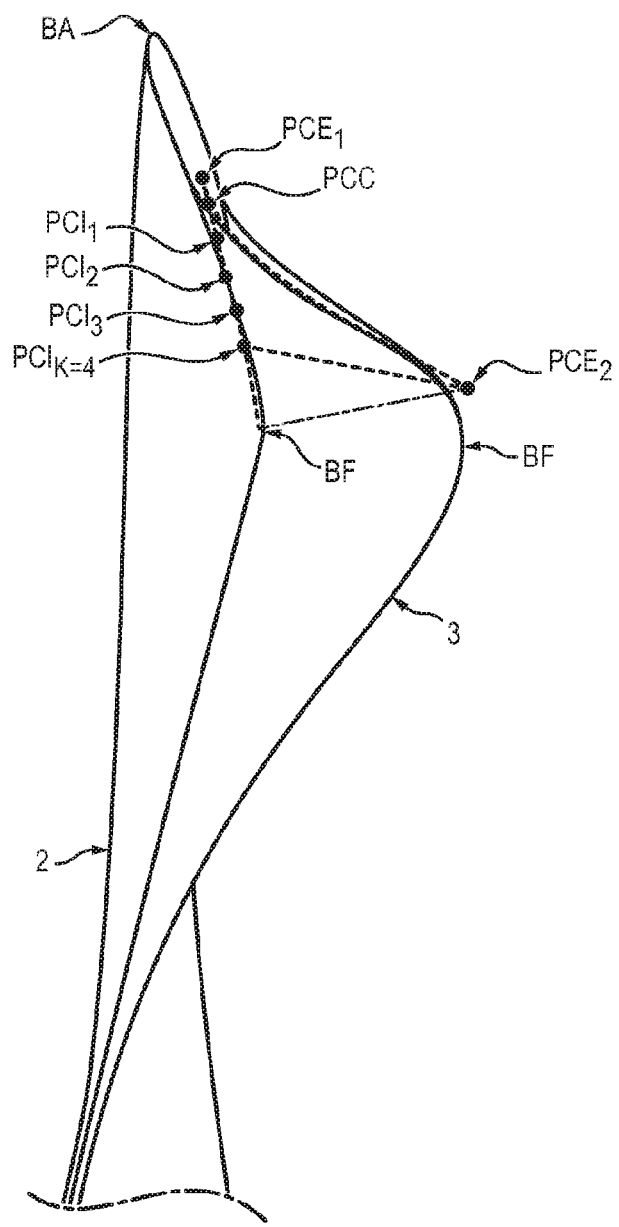
Figure 5:
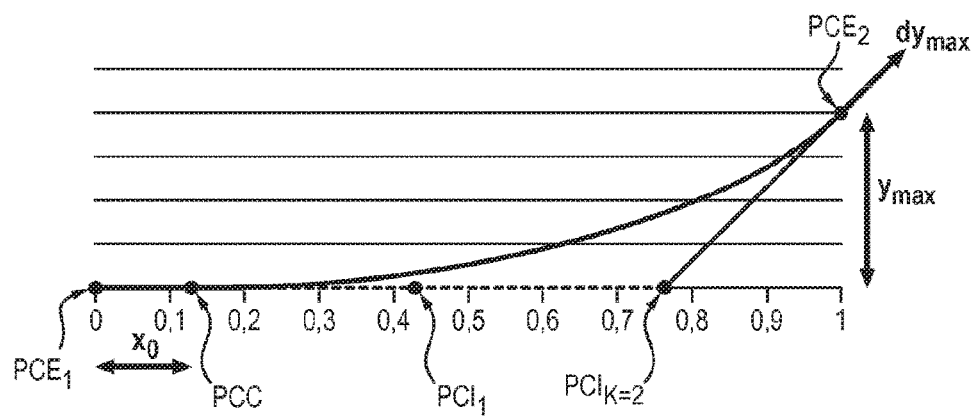
Figure 6A:
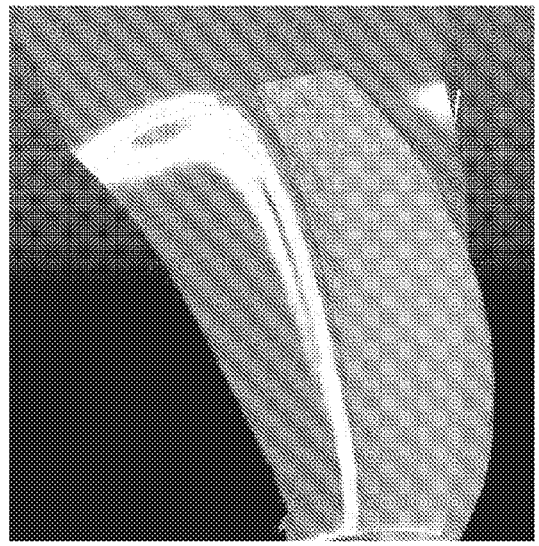
Figure 6B:
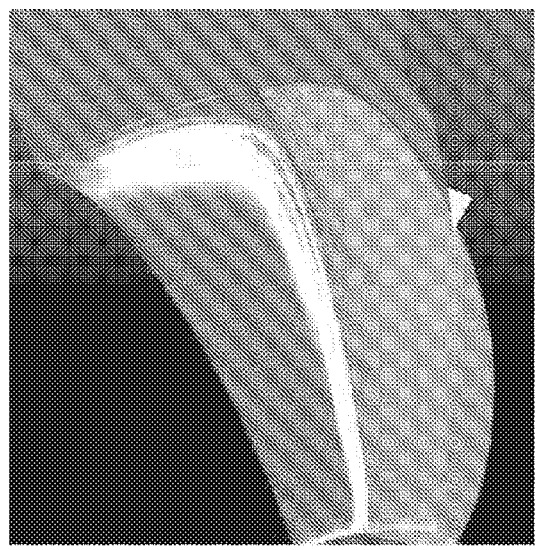

Other features and advantages of the present invention will appear upon reading the description that follows of a preferred embodiment. This description will be given with reference to the appended drawings wherein:
FIG. 1, previously described, shows an example of an open counter-rotating rotor on the blades whereof the method according to the invention is implemented;
FIGS. 2a-2b are two views of the end of a blade of a non-ducted propeller of such a rotor;
FIG. 3 shows a system for implementing the method according to the invention;
FIG. 4 illustrates the implementation of the method on a blade of a non-ducted propeller;
FIG. 5 is an example of a graph showing a deformation curve of the blade obtained thanks to an embodiment of the method according to the invention;
FIGS. 6a-6b make it possible to compare the aero-acoustic performance of a known blade and of a modeled blade thanks to the method according to the invention.

DETAILED DESCRIPTION

Blade Offset

In FIG. 1, the open rotor shown comprises a turbine 4 and two non-ducted propellers 1. These propellers 1 are, in this example, counter-rotating. Each propeller 1 has a plurality of blades 2 extending radially from the casing of the rotor.

FIGS. 2a and 2b show a detail of the tip of a blade 2. This tip is equipped with an offset 3, in other words a system of the type called "winglet." This consists of a sharp curve, which sometimes takes the form of an orthogonal winglet (as in wingtip winglets). The value of such a system is to form unloaded (Cz=0), or even negatively loaded profiles at the tip of the blade 2 by inverting the upper surface and the lower surface.

One can hope, thanks to such an offset 3, for better dissipation of wing-tip vortices generated at the end of the blade 2. However, it has not been possible up until now to obtain a geometry of the tip of the blade 2 which succeeds in doing this sufficiently for reducing the noise nuisance.

The present method is designed for the specific modeling of at least one portion of a blade 2 (its tip in particular) of a non-ducted propeller 1, the portion of the blade 2 having a tangential offset 3. The idea is to define the offset 3 for this purpose as a deformation of the "mean surface" of the blade 2 with respect to a reference plane, advantageously based on certain very specific parameters which will be described later.

The mean surface is, in a section (i.e. in a cross section) of the blade 2, a mean line which extends from a leading edge BA to a trailing edge BF. FIG. 4 shows the same blade 2 in two configurations: initial (i.e. without the offset 3, the mean line taking the shape of a straight line) and deformed (i.e. a displacement of the trailing edge so as to give a curved shape to the mean line characterizing the offset 3). This FIG. 4 will be described later in more detail. The mean line must not be confused with the chord, which also connects the leading and trailing edges in a section, but running through the envelope of the blade 2.

Orthogonally to a section is found the "elevation" of the blade 2, i.e. the position along a longitudinal axis. Each section of the blade 2 is at a given elevation in the blade 2.

It is important not to confuse the offset 3 with a "hump," i.e. a possible enlargement of the blade in its central portion. When considering a hump as a deformation, this is in the axis of the mean line of the blade 2 (the leading edge and the trailing edge are spread apart), while the offset 3 is a deformation along a direction orthogonal to the axis of the mean line.

The portion of the blade 2 is modeled, during its design, via computer equipment 10 of the type of that shown in FIG. 3. It comprises data processing means 11 (one or more processors), data storage means 12 (for example one or more hard disks), interface means 13 (consisting of data entry means such as a keyboard and a mouse or a tactile interface, and output means such as a screen for displaying the results). Advantageously, the equipment 10 is a supercomputer, but it will be understood that implementation on varied platforms is completely possible.

Even if the dissipation of vortices is the main criterion selected to be optimized during modeling of the blade, it will be understood that other criteria can be selected. By way of an example, it is possible to attempt to maximize mechanical properties such as resistance to mechanical loads, the frequency responses of the vane, the displacements of the blade, aerodynamic properties such as the efficiency, pressure rise, delivery capacity or pumping margin, etc.

Parameterization

It is necessary to parameterize the mean line deformation law that it is desired to optimize, i.e. to make it a function of N input parameters. The optimization then consists of varying (generally randomly) these different parameters with constraints, until their optimal values for the predetermined criterion of vortex dissipation are determined. A "smoothed" curve is then obtained by interpolation from the predetermined transit points.

The necessary number of calculation is then directly linked (linearly or exponentially) to the number of input parameters of the problem.

Many methods for parameterizing a law exist, and it is possible in particular to distinguish two major categories:

Discrete model: the law is defined by a plurality of points (in practice 5 to 10 for an elevation law, and 50 to 200 for a section), displaced one by one during optimization;

Parametric model: the law is defined via mathematical curves known in the literature, such as Bézier curves or NURBS (non-uniform rational B-splines).

It is desirable to use a great number of parameters to increase to the same degree the quality of a law (this is a major issue in designing blades, but such an approach is quickly limited by the capacity and the resources of current processors.

Even when using expensive supercomputers, the time required for modeling a single law is considerable.

Another problem: it is noted that in the presence of a large number of parameters, problem appear: in fact, predetermined laws have too high a number of points to be satisfied, and the first curves obtained are abnormally "wavy" (i.e. what is called the Runge phenomenon) and unusable in their current state. They have to be reworked until they are sufficiently smooth, which further increases the delay required for obtaining results.

As we will see, the present method allows excellent modeling quality for a blade 2 tip which allows, with a surprisingly reduced number of parameters, to obtain a substantial improvement in wing-tip vortex dissipation (and therefore in the noise level).

A very similar method but using alternative parameters is described in patent application FR1357449.

In one step (a), performed by data processing means 11 under the control of an operator, is a curve is parameterized representing the value of a deformation of the blade 2 (characterizing the offset 3 as explained) as a function of a position along a section of the blade 2 of the non-ducted propeller 1, at a given elevation in the blade 2. By "section" is also meant "sectioned portion," i.e. all or a portion of the space extending from the leading edge BA to the trailing edge BF.

The position along the curve is preferably expressed as a function of the length of the mean line (as an abscissa), and more precisely the length of the "normalized" mean line that is expressed between 0 and 1 when traversing the blade 2 from one edge to another. This corresponds in other words to the coordinate x that a point on the mean line would have in an ortho-normal frame of reference wherein the point BA would have (0,0) as coordinates, and the point BF (1,0). For example, a point in the section associated with a normalized mean line length of "0,5" is on the bisector of the mean line. It is noted that, as the curve can extend over only a (continuous) portion of the section of the blade 2, the associated function is defined on a subinterval of [0,1].

It will be understood, however, that the invention is not limited in any way to the expression of a curve representing the value of a deformation as a function of a mean line length, and that other frames of reference are possible (chord length, for example).

This curve representing the value of a deformation should be considered a model of the deformation law.

It has a regularity class of at least $C^1$, i.e. that it corresponds to a continuous function, continuous in at least the $1^{st}$ derivative over its definition space (the section of the blade 2). The importance of this condition will be seen below. In practice, the curve obtained is piecewise $C^\infty$ (infinitely differentiable functions on each interval), with continuity of the curve and of the derivative at the connections (the intermediate control points). It will be understood that these are minimal conditions and that the curve can of course be $C^n$ over its entire definition space.

The curve is defined thanks to its control points. In known fashion, two user end control points $PCE_1$ and $PCE_2$ are fixed and define the extent of the section (i.e. the definition domain of the curve). The modeling curve further comprises at least one central user control point PCC positioned between the two end control points $PCE_1$ and $PCE_2$.

The central point PCC is an "explicit" control point, because the curve passes through it. In fact, the latter preferably comprises two portions connected at said central point.

As will be seen, the first portion, which extends from the first end control point $PCE_1$ to a central control point PCC) preferably corresponds to the zero function. In other words, the first end control point $PCE_1$ and the central control point PCC have an ordinate of zero, as is the case with any point of the curve between them.

The second portion of the curve (which extends from the central control point PCC to the second end control point $PCE_2$) is, for its part, a parametric curve, preferably a non-uniform rational B-spline (NURBS) and/or a polynomial curve, in particular a so-called Bézier curve. The latter have the characteristic of being polynomials and of the NURBS type. They are defined as combinations of N+1 elementary polynomials so-called Bernstein polynomials: a Bézier curve is defined by all the points $\Sigma_{i=0}^{N} B_i^N(t) \cdot P_i, t \in [0,1]$, the $$B_i^N(t) = \binom{N}{i} t^N (1-t)^{N-i}$$

being the N+1 Bernstein polynomials of degree N.

The points $\{P_0, P_1 \ldots P_N\}$ are called "implicit" control points and consist of the variables thanks to which a law of a blade can be modeled by a Bezier curve (or another NURBS).

These points are called "implicit" because a Bézier curve can be seen as a set of barycenters of the N+1 control points considered with a weight equal to the value of the Bernstein polynomial associated with each control point. In other words, these points act as local weightings attracting the curve generally without having it pass through them (aside from the first and the last, corresponding respectively to t=0 and t=1, and certain cases of point alignment).

Generally, in known techniques for modeling a law using a spline, the end control points $P_0$ and $P_N$ of the curve used are fixed (they define the extend of the portion of a part on which the modeling is going to be implemented), but the other points $\{P_1 \ldots P_{N-1}\}$ have movable coordinates constituting the input parameters for the optimization algorithm.

FIG. 5 shows an example of a curve obtained by the present method, with its user control points.

In the description hereafter the preferred example will be used wherein the second portion of the curve is of the NURBS type, but it will be understood that the invention is not restricted by any parameterized curve.

In particular, each NURBS can be fully determined by the user control points defining its ends (in this case the central control point PCC and the second end control point $PCE_2$). In other words, the parameters of the control point (in terms of coordinates and derivatives) serve as limiting conditions on the calculation by data processing means 11 of the equation of the spline, which can be selected with the minimal degree sufficient for satisfying the limiting conditions. This corresponds to a situation wherein "K=0" (see below).

The parameter(s) defining the end points of the NURBS, PCC and $PCE_2$ are selected from among an abscissa of the point, an ordinate of the point, an orientation of the tangent to the curve at the point and two tension coefficients each associated with a semi-tangent to the curve at the point. Which parameterization is selected by the present invention will be seen below.

The fact that the curve is of at least class $C^1$ imposes that the central point PCC ensures continuity, comprising that of the derivative (same tangent). On the other hand, the "length" of the two semi-tangents can be different on either side of the central point (the latter is zero, in particular, to the left of the central point $PCE_2$ because all the derivatives of a zero function are zero), a length which translates the propensity of the curve on either side of the point to "stick" to the tangent. That is what is modeled by the "tension coefficients" mentioned earlier.

Alternatively K≥1, i.e. at least one intermediate control point $PCI_i$, $i \in [1, K]$ is positioned between the central control point PCC and the second end control point $PCE_2$. The intermediate control points $PCI_i$, $i \in [1, K]$ are implicit point as described previously, the abscissa and/or the ordinate whereof can serve as parameters for the parameterization. This case in particular will be described below.

In any case, the second end point $PCE_2$ is the main movable point here. In particular, the abscissa of the central control point PCC (see, as will be seen later, possible intermediate control points $PCI_i$, $i \in [1, K]$) and the ordinate of the second end point $PCE_2$ are functions of three deformation parameters (which for their part can preferably be functions of said elevation of the section in the blade 2 and if need be of complementary parameters). In other words, the parameterization is performed according to these deformation parameters.

The idea is to modify the mean line at the tip of the blade 2 in a coordinated fashion over a plurality of sections (the deformation "propagates") continuously as a function of their elevation in the blade 2 and the deformation parameter(s). In other words, a plurality of curves corresponding to sections at different elevations in the blade 2 is parameterized at step (a)

Deformation Parameters and User Control Points

The deformation parameters are:
the abscissa of the central control point PCC which is the first deformation parameter $x_0$;
the ordinate of the second end point $PCE_2$ which is the second deformation parameter $y_{max}$; and
the inclination of the tangent to the curve at the second end point $PCE_2$ (in other words the derivative of the curve at this point), which is the third deformation parameter $dy_{max}$.

These three deformation parameters make it possible by themselves to parameterize (if applicable via the elevation h, as will be seen below) all the user control points defining the modeling curve.

The control of the inclination of the tangent to the curve at the second end point $PCE_2$ is preferably accomplished via an intermediate control point as mentioned previously (this implying that the second portion of the curve is of the NURBS type and that there is at least one intermediate control point, i.e. that K≥1).

If there is more than one intermediate control point, this intermediate control point allowing control of the inclination of the tangent is the $K^{th}$ intermediate control point $PCI_K$, in other words the last intermediate control point encountered while scanning the control points from the leading edge BA toward the trailing edge BF.

In other words, in the preferred embodiment, step (a) consists of a parameterization of at least one curve of at least class $C^1$ representing a deformation of said blade 2 characterizing the offset 3, as a function of a position along a section at a given elevation in the blade 2, the curve being defined by:

a. A first and a second end control point $PCE_1$, $PCE_2$ defining the extent of said section of the blade 2);

b. a central control point PCC, and at least one intermediate control point (in this case the "$K^{th}$") $PCI_K$, positioned successively between the end points $PCE_1$, PCE$_2$, the curve passing through the central control point PCC (but in practice not through the intermediate control point PCI$_K$), the parameterization being implemented according to a first deformation parameter x$_0$ defining the abscissa of the central control point PCC, a second deformation parameter y$_{max}$ defining the ordinate of the second end point PCE$_2$, and a third deformation parameter dy$_{max}$ as a function whereof (in particular in combination with the second deformation parameter y$_{max}$) the abscissa of the intermediate control point PCI$_K$ is expressed.

As can be seen in FIG. 5 previously introduced, the ordinate of the first end control point PCE$_1$, of the central control point PCC and of each intermediate control point PCI$_i$; is advantageously selected to be fixed and equal to zero. In other terms, these K+2 first control points are aligned and on the initial mean line. Only the second end control point PCE$_2$ is separate from it.

And as explained previously, the portion of the NURBS type of the curve does not pass through the intermediate control points PCI$_i$. This alignment therefore does not create any angular points, but rather controls the progressivity of its curvature. By way of a supplementary condition (which is automatically the case when the first portion of the curve, i.e. the interval (0, x$_0$), in other words the segment [PCE$_1$–PCC], is the zero function), the derivative of the curve is constrained to be zero (horizontal tangent) at the first end control point PCE$_1$ and at the central control point PCC, because the first two control points have the same ordinate, equal to zero. In such a situation, the deformation parameter x$_0$ can be seen as a "start of deformation" value: as long as x is less than x$_0$ the mean line is not deformed (because the curve is zero), and the offset 3 exists in the interval [x$_0$, 1].

The intermediate control points PCI$_i$, i∈⟦1, K⟧ and in particular the K$^{th}$ intermediate control point PCI$_K$ are "movable" points having, for their part, a variable abscissa such that they approach the second end control point PCE$_2$ when the inclination of the tangent increases, which provides for deeper camber.

The abscissa of the K$^{th}$ intermediate control point PCI$_K$ is thus a function fo the second and third deformation parameters (y$_{max}$, dy$_{max}$), which makes it possible to control the orientation of the segment [PCI$_K$–PCE$_2$], to which the curve is tangent by definition.

The abscissa x$_K$ of the K$^{th}$ intermediate control point PCI$_K$ is in particular given by the formula $$x_K = 1 - \frac{y_{max}}{dy_{max}}.$$

This is an important difference from the parameterization proposed in application FR1357449, wherein the last intermediate control point PCI$_K$ has an abscissa which does not depend on the deformation paramaters (it is preferably chosen fixed at 0.75). With respect to this known method, the present method allows a greater variety of profiles thanks to the lever of tangency control (and therefore of the orientation of the end of the offset) and greater flexibility, while still simplifying the model. In addition, it will be shown later how the use of so-called auxiliary curves makes it possible to decouple the phenomenon.

If K≥2, then at least one other (K−1) intermediate control point exists between the central control point PCC and the K$^{th}$ intermediate ⟦ control point PCI$_K$. More precisely, the i$^{th}$ (i∈⟦1, K−1⟧) intermediate control points PCI$_i$ are movable points the abscissa x$_i$ whereof is a function of those (x$_0$, x$_K$) of the central control point and of the K$^{th}$ intermediate control point PCC, PCI$_K$.

These abscissas are preferably defined so that the movable intermediate control points have regular spacing. The abscissa x$_i$ of the K−1 movable intermediate control points PCI$_i$ with i∈⟦1, K−1⟧) is thus given by the formula $$x_{i \in \llbracket 1, K-1 \rrbracket} = x_0 + (x_K - x_0) * \frac{i}{K}$$

with (x$_K$) the abscissa of the K$^{th}$ intermediate control point PCI$_K$.

Thus generally with K≥1 (the case of FIG. 5), the coordinates of the 4 main points are:

$$PCE_1(0; 0) - \text{derivative} = 0$$
$$PCC(x_0; 0) - \text{derivative} = 0$$
$$PCI_K\left(1 - \frac{y_{max}}{dy_{max}}; 0\right)$$
$$PCE_2(1; y_{max}) - \text{derivative} = dy_{max}$$

And in an optimal situation (shown by FIG. 4) with K=4, so as to have 7 control points (with the two end points and the central point), the coordinates of the 7 points are:

$$PCE_1(0; 0)$$
$$PCC(x_0; 0;0)$$
$$PCI_1\left(x_0 + \left(1 - \frac{y_{max}}{dy_{max}} - x_0\right)/4; 0\right)$$
$$PCI_2\left(x_0 + 2*\left(1 - \frac{y_{max}}{dy_{max}} - x_0\right)/4; 0\right)$$
$$PCI_3\left(x_0 + 3*\left(1 - \frac{y_{max}}{dy_{max}} - x_0\right)/4; 0\right)$$
$$PCI_4\left(1 - \frac{y_{max}}{dy_{max}}; 0\right)$$
$$PCE_2(1; y_{max})$$

Optimization and Output

Each of the deformation parameters x$_0$, y$_{max}$, dy$_{max}$ can be a fixed parameter (entered by the user, for example) or a "variable" parameter, i.e. a parameter the value whereof can be optimized.

According to a second step (b), the method thus comprises a step of optimization by the data processing means 11 of at least one deformation parameters x$_0$, y$_{max}$, dy$_{max}$. This is an optimization step.

The parameter is either a simple parameter, i.e. independent of other parameters, and the optimization then consists of determining directly an optimized (and if possible optimal) value of the parameter, or a composite parameter, i.e. one which depends on other parameters such as the elevation of the section in the blade 2.

In the latter case, it will be understood that the deformation parameter x$_0$, y$_{max}$, dy$_{max}$ is expressed as a function of the elevation of the section in the blade 2 and of one or more complementary parameters, step (b) then consisting of determining optimized values of said complementary parameters These complementary parameters can be, among others:
a relative elevation of the beginning of the deformation $h_0$; and
a maximum offset $d_{max}$ at the end of the blade 2 (in the case where the parameter expressed as a function of h is $y_{max}$), $h_0$ is a relative, i.e. "normalized" elevation, in other words expressed between 0 and 1 when scanning the blade 2 from the root (junction with the disk of the propeller 1) to the end of the tip. This is a deformation start elevation, i.e. the offset 3 exists within the interval $[h_0, 1]$. Each (main) parameterized curve is thus associated with a relative section elevation h in the blade 2, $h \in [h_0, 1]$ (because there is no deformation for $h \in [0, h_0]$).

The maximum offset corresponds to the maximum value of the deformation over the entire offset 3, attained at the end of the blade 2 at the trailing edge BF (as can be seen in FIG. 4, the latter moves).

Below will be shown a particularly advantageous manner of expressing a deformation parameter $x_0$, $y_{max}$, $dy_{max}$ as a function of the elevation of the section in the blade 2 and of one or more complementary parameters. All that needs to be remembered is that optimization step (b) consists of the direct determination of the optimized values of one or more of the deformation parameters $x_0$, $y_{max}$, $dy_{max}$ if they are not functions of the elevation h and/or the determination of the optimized values of the complementary parameters of one or more of the deformation parameters $x_0$, $y_{max}$, $dy_{max}$ if they are not functions of the elevation h and of these complementary parameters.

Numerous techniques for the implementation of this step (b) are known to a person skilled in the art, and it is possible for example to simply vary the parameters selected to be variable pseudo-randomly while carrying out simulations to determine these optimized values (i.e. for which the chosen criterion, in particular the reduction of wing-tip vortices, is maximized) of the parameters of the control points. The invention, however, is not limited to this possibility.

In a final step (c), the values determined of the parameter(s) (whether it is the complementary parameters or the deformation parameters directly) are outputted to the interface means 13 of the equipment 10 for use, for example in displaying the modeling curve wherein the parameters are set at these optimized values.

Alternatively, the interface means 13 can display only numeric values.

Auxiliary Curve

A deformation parameter $x_0$, $y_{max}$, $dy_{max}$ can be linked to the elevation h and to one or more complementary parameters by a formula. For example it is possible to use a coefficient $$\left(\frac{h-h_0}{1-h_0}\right)^2$$

which varies quadratically between 0 and 1 when h covers the interval $[h_0, 1]$. The second deformation parameter $y_{max}$ (the ordinate of the second end control point $PCE_2$) can thus be given by the formula $$y_{max} - d_{max} * \left(\frac{h-h_0}{1-h_0}\right)^2.$$

Similarly, the first deformation parameter $x_0$ (the abscissa of the first intermediate control point PCC) can for its part be proportional to $$1 - \left(\frac{h-h_0}{1-h_0}\right)^2.$$

Thus with greater elevation in the blade 2, the more the weight of the intermediate control points is offset toward the leading edge, increasing in the process the curvature of the Bézier curve, and increasing the portion of the mean line which is deformed (at the root of the offset 3, only a small area at the trailing edge BF is curved, while the offset 3 reaches the entire width of the blade 2 at its tip).

But preferably, curves of class $C^1$ of the same type as that representing a deformation of said blade 2 will be used, characterizing the offset 3, described earlier.

Such "auxiliary curves" model a distribution law, the curve(s) previously described (so-called "main curves") model a deformation law. A distribution law has the same format as a deformation law, where x is replaced by h, and y by the deformation parameter $x_0$, $y_{max}$, $dy_{max}$.

These auxiliary curves make it possible to cause a controlled increase in the value of the deformation parameters as and to the extent that the elevation in the blade 2 increases, and increasing very substantially the variety of the offsets 3 which can be modeled while preserving the advantages in terms of modeling quality and effectiveness of the general parameterization.

For the particular case of the parameter $x_0$, the auxiliary curve preferably expresses, not $x_0$ but rather $1-x_0$ (because $x_0$ has an inverse variation to that of the other deformation parameters when increasing the elevation along the blade 2.

More precisely, the method can comprise, for at least one deformation parameter $x_0$, $y_{max}$, $dy_{max}$ expressed as a function of the elevation of the section in the blade 2 and of one or more complementary parameters, a preliminary step (a0) of parameterizing at least one auxiliary curve representing the value of said deformation parameter $x_0$, $y_{max}$, $dy_{max}$ as a function of the elevation of the section in the blade 2.

Similarly to the main curve (that modeling the offset 3), the auxiliary curve is defined by a first and a second end control point defining the extent of said elevation of the blade 2, and at least one central control point positioned between the end points. It preferably consists of the zero function between the first end control point and the central control point, then of a NURBS between the central control point and the second end control point.

Its parameterization is implemented according to at least said complementary parameters, as a function whereof the central control point and/or the second end point of the auxiliary curve are defined.

Preferably, an auxiliary curve has exactly the same type of parameterization as the main curve, and the complementary parameters define for this auxiliary curve the abscissa of the central control point, the ordinate of the second end point and/or the inclination of the tangent to the auxiliary curve at the second end point.

It is thus possible to have a homology between the complementary parameter $h_0$ of a distribution law and the primary deformation parameter $x_0$ of a deformation law, or between the complementary parameter $d_{max}$ and the second deformation parameter $y_{max}$ (in the case of the representation of $y_{max}$ as a function of h).

Tests

Tests have been performed on blades 2 thus modeled, so as to verify the possibility of being able to, for a given blade, substantially increasing the dissipation of wing-tip vortices.

FIGS. 6a and 6b represent, respectively for a conventional blade and for a blade 2 whose offset 3 has been optimized thanks to the present method, the vorticity (in other words the intensity of the wing-tip vortex) downstream of the non-ducted propeller 1 upstream of the open rotor of FIG. 1.

A reduction in the intensity of the maximum vorticity on the order of 30% to 40% is noted. Also noted is that the inception of the vortex occurs at a slightly smaller radius for the new blade 2.

Therefore the optimization of only the tangential offset 3 clearly shows a considerably modification of the vortex physics at the propeller blade tip, both at high speed (modification of the trajectory, spinning), and at low speed (considerable reduction in vortex intensity and a spanwise offset in inception).

Method of Manufacture and Propeller

Once the tip is modeled, the blade 2 can be manufactured. Thus proposed is a method for manufacturing a blade 2 of a non-ducted propeller 1, the blade 2 having an offset 3, the method comprising steps of:

performing the method according to the first aspect so as to model at least one portion of the blade;

Manufacturing said blade 2 in conformity with the modeling of the at least one portion of the blade 2 obtained.

A non-ducted propeller 1 comprising a plurality of blades 2 thus produced can be obtained. Each of its blades thus has the offset 3 allowing improvement of the dissipation of wing-tip vortices and thus reduction in the noise level, without however reducing its performance.

Equipment

The equipment 10 (shown in FIG. 3) for implementing the method for modeling at least one portion of a blade 2 comprises data processing means 11 configured to implement:

A parameterization module of a curve of class $C^1$ representing a deformation of said blade 2 characterizing the offset 3, as a function of position along a section at a given elevation in the blade 2, the curve passing successively through a first end control point $PCE_1$, a central control point PCC and a second end control point $PCE_2$, the first and second control end points $PCE_1$, $PCE_2$ defining the extent of said section of the blade 2, the parameterization being performed according to a first deformation parameter $x_0$ defining the abscissa of the central control point PCC, a second deformation parameter $y_{max}$, defining the ordinate of the second end control point $PCE_2$, and a third deformation parameter $dy_{max}$ defining the inclination of the tangent to the curve at the second end control point $PCE_2$;

A module for optimization of said at least one deformation parameter;

A module for outputting to an interface 13 of said equipment 10 the values determined.

Computer Program Product

According to another aspect, the invention relates to a computer program product comprising code instruction for executing (on data processing means 11, in particular those of the equipment 10) a method according to the first aspect of the invention for modeling at least one portion of a blade 2 of a non-ducted propeller 1, as well as storage means readable by computer equipment (for example a memory 12 of this equipment 10) on which is located this computer program product.

The invention claimed is:

1. A method for manufacturing a blade of a non-ducted propeller, at least one portion of the blade having a tangential offset along a direction orthogonal to a longitudinal axis of said blade, said method comprising:

modeling said at least one portion of the blade by a data processor of a piece of equipment, the modeling comprising:

(a) parameterizing a curve of at least class $C^1$ representing a deformation of said blade characterizing the tangential offset as a function of a position along a section at a given elevation in the blade, the curve running successively through a first end control point ($PCE_1$), a central control point (PCC), and a second end control point ($PCE_2$), the first and second end control points ($PCE_1$, $PCE_2$) defining an extent of said section of the blade, the parameterization being performed according to a first deformation parameter ($x_0$) defining an abscissa of the central control point (PCC), a second deformation parameter ($y_{max}$) defining an ordinate of the second end point ($PCE_2$), and a third deformation parameter ($dy_{max}$) defining an inclination of a tangent to the curve at the second end control point ($PCE_2$);

(b) optimizing at least one of the deformation parameters; and (c) outputting to an interface of said equipment of the values of the optimized parameters; and manufacturing the blade in conformity with the modeling of the at least one portion of the blade having the tangential offset along the direction orthogonal to the longitudinal axis of said blade obtained.

2. The method according to claim 1, wherein said curve comprises a non-uniform rational B-spline (NURBS) extending between the central control point (PCC) and the second end point ($PCE_2$).

3. The method according to claim 2, wherein at least one intermediate control point ($PCI_i$, $i \in [1, K]$, $K \geq 1$) is positioned between the central control point (PCC) and the second end control point ($PCE_2$), the NURBS being defined by the central control point (PCC), the intermediate control points ($PCI_i$, $i \in [1, K]$) and the second end control point ($PCE_2$).

4. The method according to claim 3, wherein an abscissa of a $K^{th}$ intermediate control point ($PCI_K$) is a function of the second and third deformation parameters ($y_{max}$, $dy_{max}$).

5. The method according to claim 4, wherein the abscissa ($x_K$) of the $K^{th}$ intermediate control point ($PCI_K$) is given by $$x_K = 1 - \frac{y_{max}}{dy_{max}}.$$

6. The method according to claim 4, wherein $K \geq 2$, the $i^{th}$ ($i \in [1, K-1]$) intermediate control point(s) ($PCI_i$) being movable points, an abscissa ($x_i$) whereof is a function of the abscissas ($x_0$, $x_K$) of the central control point and of the $K^{th}$ intermediate control point (PCC, $PCI_K$).

7. The method according to claim 6, wherein the abscissa ($x_i$) of the K−1 movable intermediate control points ($PCI_i$, $i \in [1, K-1]$) is given by $$x_{i \in [\![1, K-1]\!]} = x_0 + (x_K - x_0) * \frac{i}{K}$$

with ($x_K$) the abscissa of the $K^{th}$ intermediate control point ($PCI_K$).

8. The method according to claim 1, wherein an ordinate of each intermediate control point ($PCI_i$) is equal to zero.

9. The method according to claim 1, wherein said curve is zero between the first end control point ($PCE_1$) and the central control point (PCC).

10. The method according to claim 1, wherein a tangent to the curve at the central control point (PCC) is horizontal.

11. The method according to claim 1, wherein a plurality of curves corresponding to sections at different elevations in the blade is parameterized at step (a).

12. The method according to claim 1, wherein the optimized values determined at step (b) are values of the parameters for which an intensity of a wing-tip vortex generated by the blade is minimized.

13. The method according to claim 1, wherein at least one deformation parameter ($x_0$, $y_{max}$, $dy_{max}$) is expressed as a function of the elevation of the section in the blade and of one or more complementary parameters, step (b) including determining optimized values of said complementary parameters.

14. The method according to claim 13 comprising, for at least one deformation parameter ($x_0$, $y_{max}$, $dy_{max}$) expressed as a function of the elevation of the section in the blade and of one or more complementary parameters, a preliminary step (a0) of parameterizing at least one auxiliary curve of at least class $C^1$ representing the value of said deformation parameter ($x_0$, $y_{max}$, $dy_{max}$) as a function of the elevation of the section in the blade, the auxiliary curve running successively through a first end control point, a central control point and a second end control point ($PCE_2$), the first and second end control points ($PCE_1$, $PCE_2$) defining the extent of said elevation of the blade;

said parametrizing being implemented according to at least said complementary parameters, as a function whereof at least one of the central control point and the second end control point of the auxiliary curve are defined.

15. The method according to claim 14, wherein the complementary parameters define, for the auxiliary curve, at least one of an abscissa of the intermediate control point, the ordinate of the second end point, and the inclination of the tangent to the auxiliary curve at the second end point.

16. A non-ducted propeller comprising a plurality of blades obtained via the method according to claim 1.

* * * * *